United States Patent
Hellmund et al.

(10) Patent No.: US 10,199,332 B2
(45) Date of Patent: Feb. 5, 2019

(54) METHOD OF MANUFACTURING A SEMICONDUCTOR DEVICE COMPRISING A SUPPORT ELEMENT AND SEMICONDUCTOR DEVICE COMPRISING A SUPPORT ELEMENT

(71) Applicant: Infineon Technologies AG, Neubiberg (DE)

(72) Inventors: Oliver Hellmund, Neubiberg (DE); Peter Irsigler, Obernberg/Inn (AT); Sebastian Schmidt, Munich (DE); Hans-Joachim Schulze, Taufkirchen (DE); Martina Seider-Schmidt, Munich (DE)

(73) Assignee: INFINEON TECHNOLOGIES AG, Neubiberg (DE)

(*) Notice: Subject to any disclaimer, the term of this patent is extended or adjusted under 35 U.S.C. 154(b) by 0 days.

(21) Appl. No.: 15/587,184

(22) Filed: May 4, 2017

(65) Prior Publication Data
US 2017/0323858 A1    Nov. 9, 2017

(30) Foreign Application Priority Data
May 9, 2016   (DE) .................. 10 2016 108 500

(51) Int. Cl.
| H01L 23/00 | (2006.01) |
| H01L 21/306 | (2006.01) |
| H01L 21/768 | (2006.01) |
| H01L 23/528 | (2006.01) |
| H01L 29/08 | (2006.01) |
| H01L 29/66 | (2006.01) |
| H01L 29/78 | (2006.01) |

(Continued)

(52) U.S. Cl.
CPC ...... *H01L 23/562* (2013.01); *H01L 21/30604* (2013.01); *H01L 21/76895* (2013.01); *H01L 23/528* (2013.01); *H01L 29/0657* (2013.01); *H01L 29/0865* (2013.01); *H01L 29/41741* (2013.01); *H01L 29/66674* (2013.01); *H01L 29/66734* (2013.01); *H01L 29/7801* (2013.01); *H01L 29/7813* (2013.01); *H01L 21/304* (2013.01); *H01L 21/30625* (2013.01)

(58) Field of Classification Search
CPC ................... H01L 23/562; H01L 21/30604
USPC .......................................... 257/335; 438/149
See application file for complete search history.

(56) References Cited

U.S. PATENT DOCUMENTS

| 8,587,121 B2 | 11/2013 | Koester et al. |
| 9,184,112 B1 | 11/2015 | Gambino et al. |

(Continued)

FOREIGN PATENT DOCUMENTS

| DE | 112010005236 T5 | 11/2012 |
| DE | 102013113751 A1 | 6/2014 |

*Primary Examiner* — Jami V Miller
(74) *Attorney, Agent, or Firm* — Slater Matsil, LLP

(57) ABSTRACT

A semiconductor device includes a power transistor in a semiconductor substrate portion, where the semiconductor substrate portion includes a central portion and a kerf, components of the power transistor are arranged in the central portion, and the central portion has a thickness d. The semiconductor device also includes a support element disposed over a main surface of the central portion, where the support element has a smallest lateral extension t at a side adjacent to the main surface of the semiconductor substrate portion and a height h, where $0.1 \times h \leq d \leq 4 \times h$ and $0.1 \times h \leq t \leq 1.5 \times h$.

24 Claims, 10 Drawing Sheets

(51) Int. Cl.
*H01L 29/417* (2006.01)
*H01L 29/06* (2006.01)
H01L 21/304 (2006.01)

(56) References Cited

U.S. PATENT DOCUMENTS

| | | |
|---|---|---|
| 9,209,080 B2 | 12/2015 | Schneegans et al. |
| 9,893,175 B2 * | 2/2018 | Mauder .................. H01L 29/78 |
| 2001/0038310 A1 * | 11/2001 | Olofsson ................ H01L 23/36 |
| | | 330/250 |
| 2002/0076851 A1 * | 6/2002 | Eden .................. H01L 23/4824 |
| | | 438/106 |
| 2010/0051963 A1 * | 3/2010 | Otremba .............. H01L 29/205 |
| | | 257/77 |

* cited by examiner

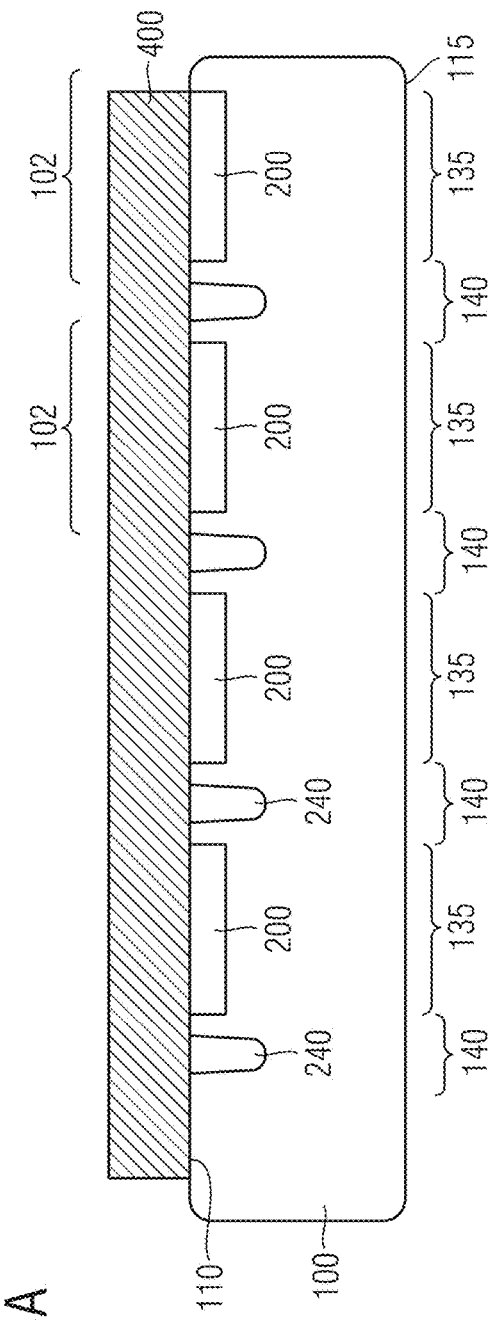
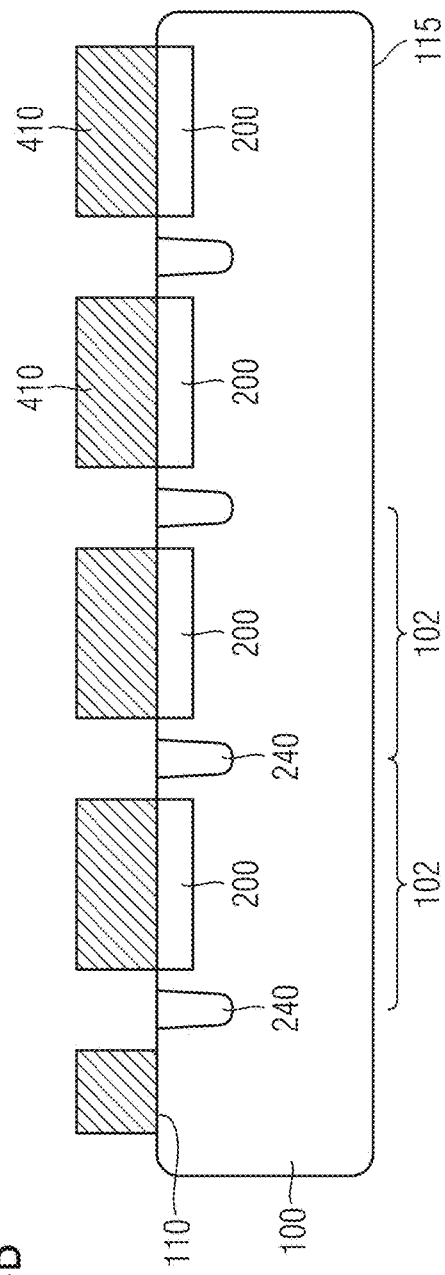

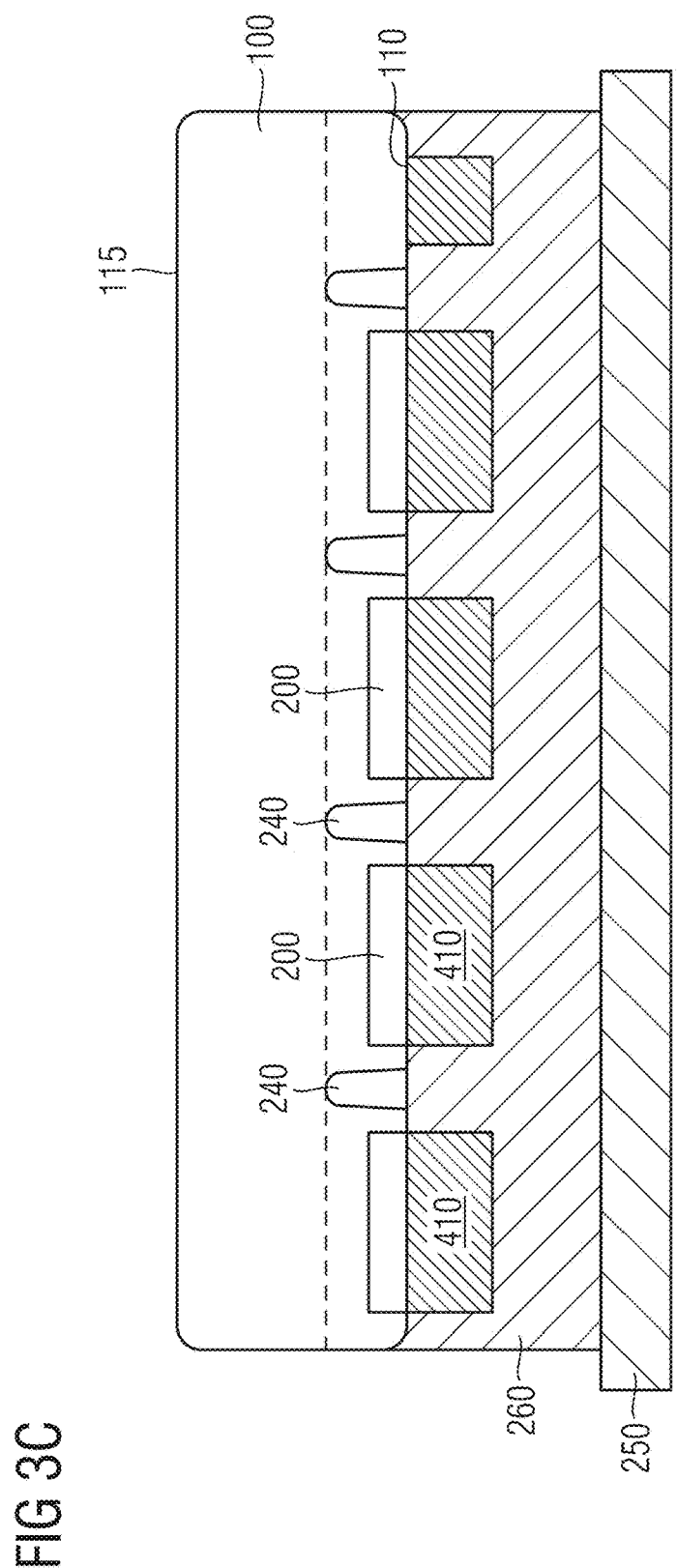

METHOD OF MANUFACTURING A SEMICONDUCTOR DEVICE COMPRISING A SUPPORT ELEMENT AND SEMICONDUCTOR DEVICE COMPRISING A SUPPORT ELEMENT

This application claims priority to German patent application No. 102016108500.6, filed on May 9, 2016, which application is hereby incorporated herein by reference in its entirety.

BACKGROUND

Power devices, for example, MOS power transistors attempt to achieve a small on-resistance which is defined by $R_{on} \times A$, wherein A denotes the area of the transistor. At the same time, a high breakdown voltage $V_{DS}$ when being in an off-state is desired. Approaches have been made to manufacture these power transistors on thin to ultra-thin substrates having a thickness of less than 100 µm, for example, 70 µm or less and even having a thickness of 10-20 µm, depending on the voltage class in which the device is being employed.

Generally, when manufacturing semiconductor devices, components of the semiconductor devices are processed by processing semiconductor wafers. After manufacturing the single devices, the wafer is isolated into single chips. When handling thin or ultra-thin substrates, problems involved with stability of the single chips may occur.

SUMMARY

According to an embodiment, a semiconductor device comprises a power transistor in a semiconductor substrate portion, the semiconductor substrate portion comprising a central portion and a kerf. Components of the power transistor are arranged in the central portion, the central portion having a thickness d. The semiconductor device further comprises a support element disposed over a main surface of the central portion. The support element has a smallest lateral extension t at a side adjacent to the main surface of the semiconductor substrate portion and a height h, wherein $0.1 \times h \leq d \leq 4 \times h$ and $0.1 \times h \leq t \leq 1.5 \times h$.

According to a further embodiment, a method of manufacturing a semiconductor device comprising a power transistor in a semiconductor substrate portion comprises forming components of the power transistor in a first main surface of a semiconductor substrate in a central portion of the semiconductor substrate portion. The method further comprises, thereafter, thinning the semiconductor substrate to a thickness less than 100 µm, and, thereafter, patterning the semiconductor substrate at a second main surface thereof to form a support element extending in a horizontal direction over the second main surface in the central portion of the semiconductor substrate portion.

According to a further embodiment, a method of manufacturing a semiconductor device comprising a power transistor in a semiconductor substrate portion comprises forming components of the power transistor in a first main surface of a semiconductor substrate in a central portion of the semiconductor substrate portion. The method further comprises thinning the semiconductor substrate to a thickness d less than 100 µm, forming a support layer over a surface of the semiconductor substrate, the support layer having a thickness h, wherein $0.1 \times h \leq d \leq 4 \times h$, patterning the support layer to form a support element over the surface of the semiconductor substrate in the central portion of the semiconductor portion, and, thereafter, forming a metallization layer over the support layer.

Embodiments of the present invention to provide an improved method of manufacturing a semiconductor device and provide an improved semiconductor device.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts:

FIGS. 3A to 3D illustrate steps of a method of manufacturing a semiconductor device according to an embodiment;

DETAILED DESCRIPTION OF ILLUSTRATIVE EMBODIMENTS

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to other embodiments, silicon carbide (SiC) or gallium nitride (GaN) may form the semiconductor substrate material.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

Figure 1A:
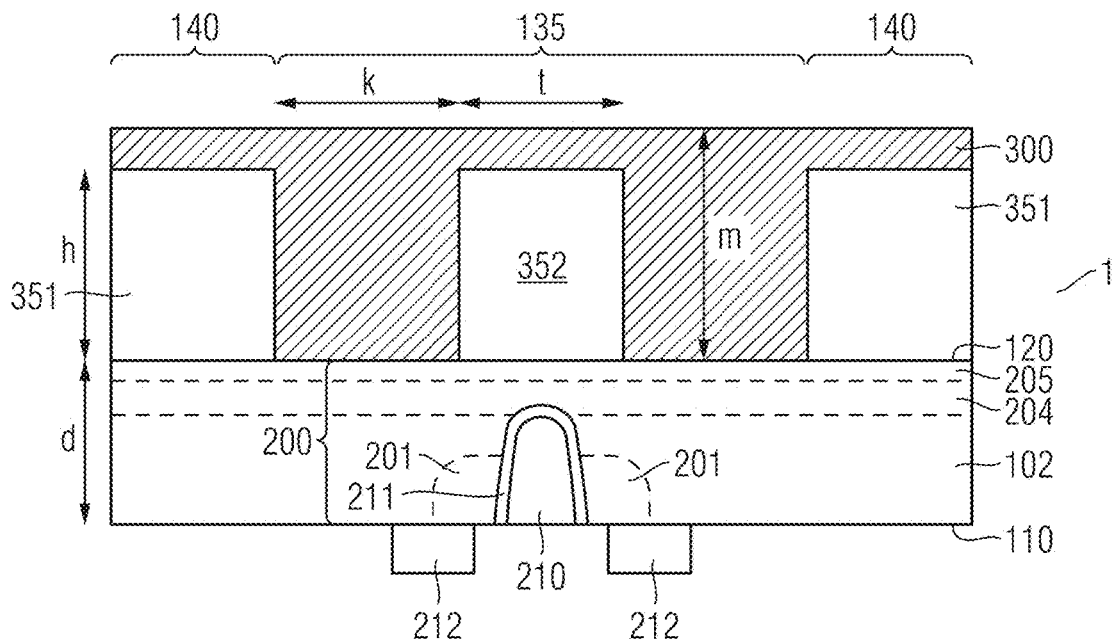
FIGS. 1A and 1B show vertical cross-sectional views of semiconductor devices according to embodiments.

FIG. 1A shows a vertical cross-sectional view of a semiconductor device according to an embodiment. The semiconductor device 1 shown in FIG. 1A comprises a power transistor 200 formed in a semiconductor substrate portion (semiconductor chip) 102 having a thickness d. The semiconductor substrate portion 102 comprises a central portion 135 and a kerf 140. Generally, components of the transistor may be formed in the central portion 135. When isolating the wafer into single chips 102, the separating process which may comprise e.g. dicing, sawing etc. may be performed in the kerf 140. Further, test structures may be disposed in the kerf 140.

The semiconductor device 1 comprises a support element 352 that extends in a horizontal direction and is disposed over a surface of the central portion 135. According to further embodiments, the semiconductor device may further comprise a stabilizing element 351 that is disposed in the kerf 140.

The support element 352 has a width t at a side adjacent to the surface 120 of the semiconductor substrate. The width t refers to a smallest lateral extension of the support element 352. The support element has a height h, wherein the following relations hold: $0.1 \times h \leq d \leq 4 \times h$ and $0.1 \times h \leq d \leq 1.5 \times h$. The stabilizing element 351 may have a similar height and a similar width as described by the above relations.

For example, components of the power transistor 200 may be formed at a first main surface no of the semiconductor substrate portion 102. The power transistor 200 may comprise a source region 201 which may be arranged adjacent to the first main surface no. The transistor further comprises a drain region 205 that may be arranged adjacent to the second main surface 120. The transistor may further comprise a gate electrode 210 which may be insulated from adjacent semiconductor material by means of a gate dielectric layer 211. For example, when an appropriate gate voltage is applied to the gate electrode 210, a conductive inversion layer may be formed at an interface between the gate dielectric layer 211 and adjacent semiconductor material, and a current flow may be controlled by the gate voltage. The power transistor may further comprise a drift zone 204 arranged between the gate electrode 210 and the drain region 205. The transistor 200 shown in FIG. 1A further comprises source contacts 212.

The support element 352 may be disposed adjacent to a second main surface 120 of the semiconductor substrate portion 102 which may be opposite to the first main surface no. According to further embodiments, the support element 352 may be disposed adjacent to the first main surface no. For example, especially in cases in which the support element 352 is disposed at the second main surface 120, the support element 352 may comprise the semiconductor substrate material. For example, in this case, the support element may be formed by correspondingly patterning the second main surface (back side) 120 of the semiconductor substrate.

According to an embodiment, a distance k between the support element 352 and the stabilizing element 351 fulfills the following relationship: $t \leq k \leq 100 \times t$.

The semiconductor device 1 may further comprise a metallization layer 300, 400. For example, the metallization layer may be formed so that the support element 352 is embedded in the metallization layer. The term "embedded" may mean that a portion of the metallization layer 300 is disposed between adjacent portions of the support element 352 and, optionally, the stabilizing element 351. Further, the metallization layer 300 may be arranged over the support element 352 and, optionally, the stabilizing element 351. According to further embodiments, a portion of the support element 352 may have a surface extending above the surface of the metallization layer. According to a further embodiment, a surface of the metallization layer 300 may be flush with a surface of the support element 352.

The semiconductor substrate portion 102 may have a thickness of less than 100 μm, e.g. 50 μm or less, 40 μm or less or even less than 20 or 10 μm, e.g. 5 or 4 μm. For example, the thickness of the semiconductor substrate portion 102 is intended to mean a thinnest thickness of the semiconductor substrate portion 102, e.g. the thickness of the semiconductor substrate portion 102 which remains after patterning the semiconductor substrate. For example, patterning processes including etching processes may be performed so as to define the support element 352. For example, the thickness of the semiconductor substrate portion 102 refers to the distance between second main surface 120 and first main surface 110.

The height of the support element refers to a difference between a horizontal surface of the support element 352 and bottom side of the support element. For example, in case the support element is integrally formed with the semiconductor substrate portion adjacent to the second main surface 120, the height h corresponds to a difference between a horizontal surface of the support element 352 and the second main surface 120 of the semiconductor substrate portion 102.

Figure 1B:
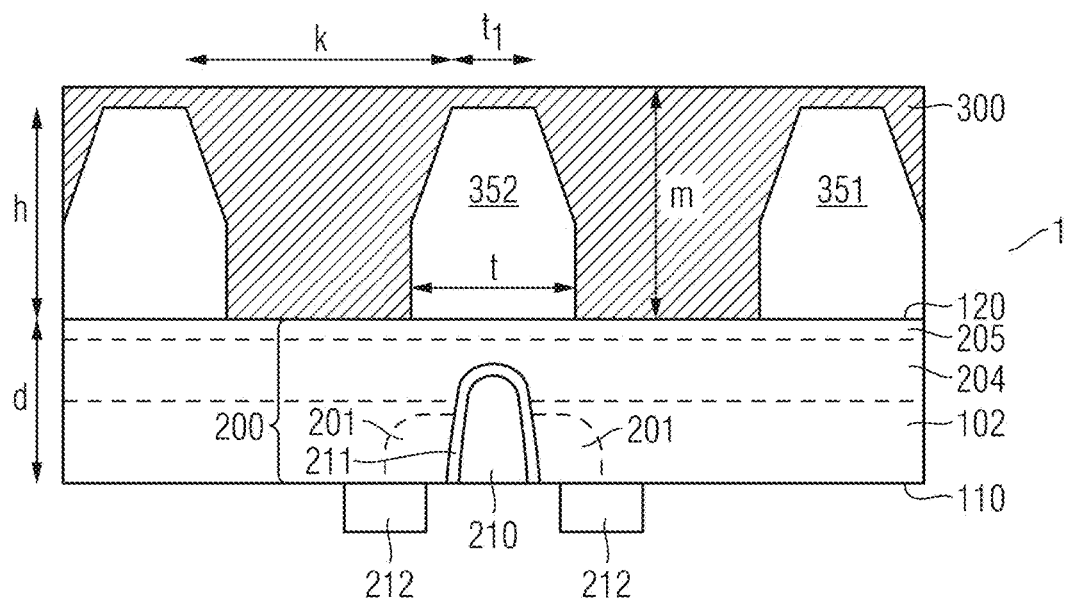

The width t of the support element 352 is measured at a side adjacent to the surface of the semiconductor substrate. As is illustrated in FIG. 1B, the support element 352 may have a tapered shape having a larger width at a bottom side than at a top side thereof. In this case, the width t refers to a width on a side adjacent to the second main surface 120 of the semiconductor substrate portion 102 and may further refer to the largest width of the support element 352.

According to further embodiments, the support element 352 may further comprise a material which is different from the substrate material. The support element 352 may be arranged in direct contact with the first or second main surface 110, 120 of the semiconductor substrate portion 102.

FIG. 1B shows an embodiment according to which the support element has a tapered shape. As a result, the volume needed for the support element is decreased, while maintaining a mechanical stability due to the larger width at the bottom side of the support element 352. When determining shape and size of the support element 352, the resistance of a metallization layer formed over the support element 352 should be taken into account. According to the embodiment of FIG. 1B stability and, at the same time, the resistance of the metallization layer may be optimized. As is illustrated in FIG. 1B, the lateral extension or width $t_1$ of the support element 352 at a side remote from the semiconductor substrate portion 102 may be smaller than the width t of the support element 352 at a side adjacent to the semiconductor substrate portion 102.

Figure 1C:
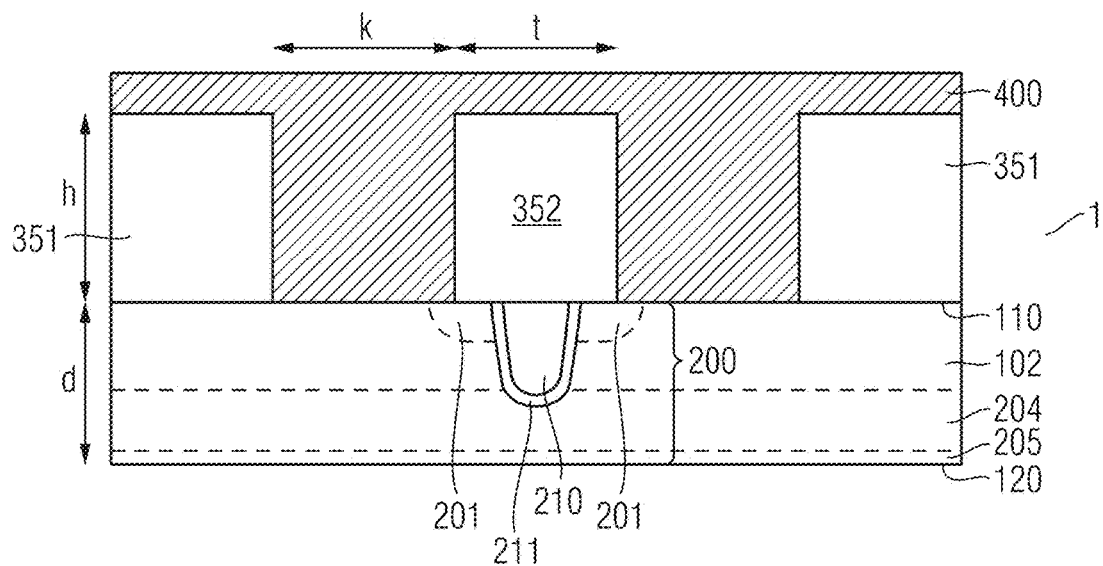
FIGS. 1C and 1D show vertical cross-sectional views of semiconductor devices according to further embodiments.

FIG. 1C shows a further embodiment of the semiconductor device. The components shown in FIG. 1C are similar to those shown in FIG. 1A. Differing from the embodiment shown in FIG. 1A, the support element 352 is formed adjacent to the first main surface no, e.g. on a side adjacent to the components of the power transistor 200. For example, the support element 352 may be formed of a material different from semiconductor material.

Figure 1D:
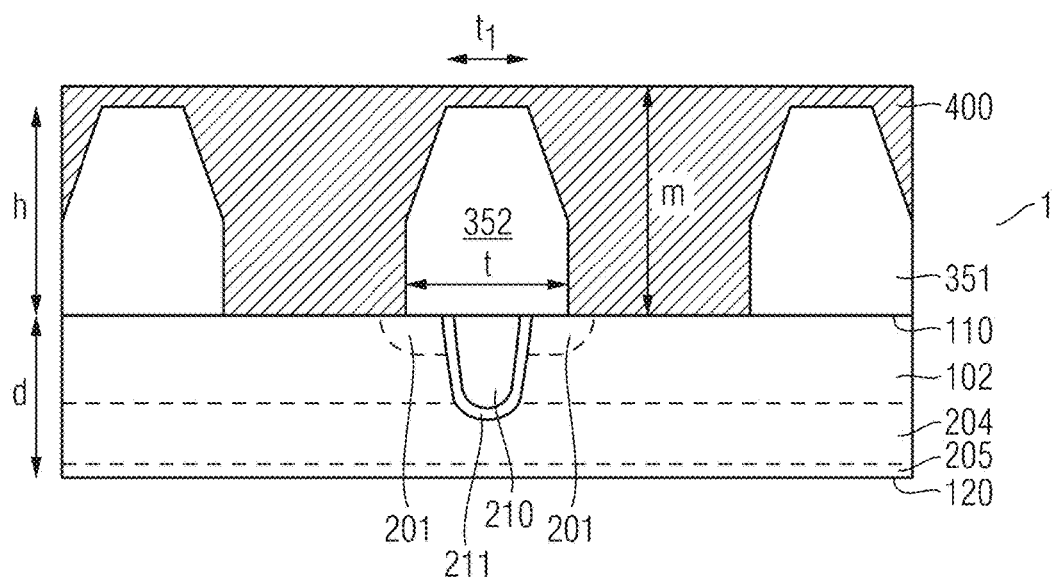

FIG. 1D shows a cross-sectional view of a semiconductor device according to still a further embodiment. According to the embodiment of FIG. 1D, the support element 352 has a tapered shape. As is illustrated, the lateral extension or width $t_1$ of the support element 352 at a side remote from the semiconductor substrate portion 102 may be smaller than the width t of the support element 352 at a side adjacent to the semiconductor substrate portion 102.

Figure 1E:
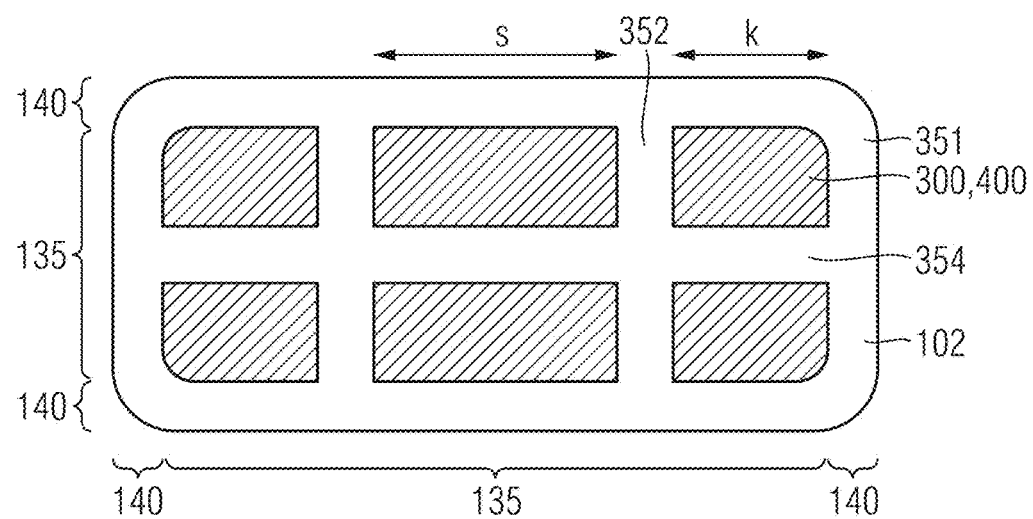
FIG. 1E shows an example of a horizontal cross-sectional view of a semiconductor device according to an embodiment.

FIG. 1E shows a horizontal cross-sectional view of the semiconductor device. For example, the cross-sectional view of FIG. 1E may be taken so as to intersect a portion of the stabilizing element 351, the support element 352 and of the metallization layer 300, 400.

As is shown in FIG. 1E, the stabilizing element 351 may be arranged along the circumference of the semiconductor chip (semiconductor substrate portion) 102 and may be disposed in the kerf 140. Moreover, support elements 352 which may extend in a first direction, e.g. the X direction and in a second direction, e.g. the Y direction may be disposed in the central portion 135 of the semiconductor chip 102.

According to an embodiment, a distance s between the support element 352 and an adjacent further support element 352 fulfills the following relationship: t≤s≤100×t. As is further illustrated in FIG. 1E, the distance s between the support element 352 and an adjacent further support element 352 measured in a first direction, e.g. the x direction, may be different from the distance s between the support element 352 and an adjacent further support element 352 measured in a second direction, e.g. the y direction. Further, a distance k between the support element 352 and a stabilizing element 351 measured in the first direction may be different from the distance k between the support element 352 and the stabilizing element 351 measured in the second direction.

Figure 2A:
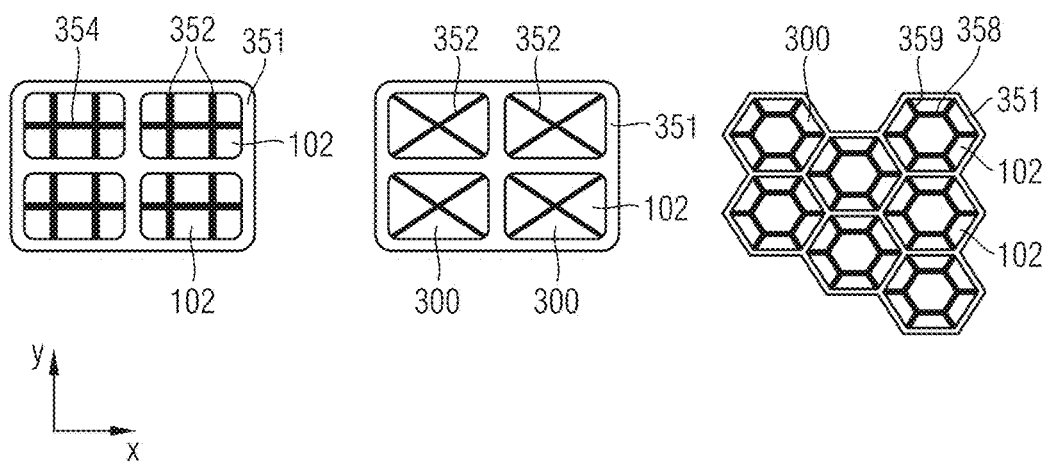
FIGS. 2A to 2C show horizontal cross-sectional views of a semiconductor device according to an embodiment.
Figure 2B:
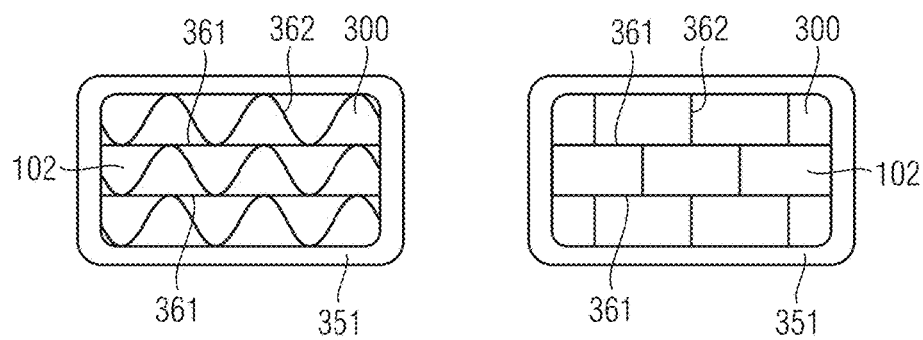
Figure 2C:
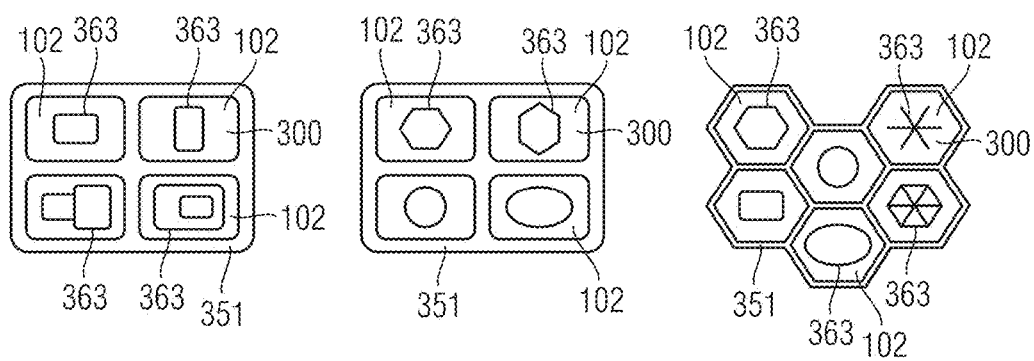

FIGS. 2A to 2C show examples of layouts of semiconductor devices 1 comprising the support element 352. FIG. 2A shows several examples of arrangements of semiconductor chips 102 which may have a rectangular shape or a hexagonal (honeycomb) shape. The stabilizing element 351 may be arranged along the circumference of the single chips 102. In more detail, the stabilizing element 351 may be arranged in the kerf 140.

Moreover, the semiconductor device may comprise support elements 352 arranged in the central portion 135 so as to connect portions of the stabilizing element 351. For example, the support element 352 may extend in the first direction or the second direction. According to further implementations, the support element 352 may extend diagonally with respect to the first and second direction. When the semiconductor chips 102 have a honeycomb shape, support element 352 may comprise first and second support elements 358, 359. The first support element 358 may also form a hexagonal shape and the second support element 359 may radially extend from the first support element 358 to the stabilizing element 351 arranged in the kerf 140.

According to the embodiment of FIG. 2B, the support element 352 may comprise first and second support elements 361, 362. The first support elements 361 may extend in the first direction, e.g. the X direction. Second support elements 362 may connect adjacent first support elements 361 with each other. For example, the second support elements 362 may run in a diagonal direction or in the second direction, e.g. the Y direction. According to a further embodiment, the second support elements 362 may have a corrugated or undulating shape to connect adjacent first support elements 361 with each other. Due to this structure of the support element 352, the stability may be increased.

According to the embodiment of FIG. 2C, the support element 363 is not connected with the stabilizing element 351 in the kerf of the semiconductor chip 102. For example, the support element 363 may have different shapes. For example, the support elements 363 may form closed or open loops and may have any of the indicated shapes.

According to embodiments, the thickness d of the semiconductor substrate portion 102 may be less than 100 µm, e.g. less than 40 µm or less than 25 µm or less than 20 µm. For example, the thickness may be less than 10 µm, e.g. 4 µm. A width t of the support element 352 may be 5 to 30 µm, for example, 10 to 20 µm, e.g. 10 to 15 µm. In case of a thinner thickness d of the semiconductor substrate portion 102, the width t of the support element 352 may be smaller. For example, $0.1 \times t \leq d \leq 10 \times t$, more specifically $0.2 \times t \leq d \leq 5 \times t$. The support element may have a thickness h which may be larger than 0.5×d, for example, larger than d. By way of example, the height of the support element may be less than 40 µm, e.g. less than 25 µm. For example $0.1 \times h \leq d \leq 4 \times h$ and $0.1 \times h \leq t \leq 1.5 \times h$.

Generally, the support element implements a small firm structure which may be supported by the silicon substrate. The support element may further stabilize the semiconductor chip. This may be useful in the case of very thin to ultrathin semiconductor chips. Further, the risk of warpage on wafer and chip level may be reduced, which could take place in frontend processes and in backend processes, e.g. when performing a soldering process.

As is shown in FIGS. 2A to 2C, the semiconductor device may further comprise a stabilizing element 351. For example, the stabilizing element 351 and the support element 352 may be formed of similar or identical materials and by similar processes. For example, patterning of a surface of the semiconductor substrate or of a layer over the semiconductor substrate may be performed so as to simultaneously form the stabilizing element 351 in the kerf 140 and in the central portion 135 of the semiconductor substrate portion 102.

The semiconductor device may further comprise a metal which may be, e.g. formed by electroplating and planarization after the electroplating process or by depositing, e.g.

using a metal paste. Further examples of methods comprise metal printing. According to further embodiments, a metallization layer may be absent from the first and/or second main surface. In this case, the space between the support elements or the components of the support element may be filled with contact glue or with air, in case a Si membrane is disposed over the support element.

According to further embodiments, the support element may also be used as an electrically active component such as a resistor, diode, temperature sensor etc. For example, this may be implemented in the case in which the support element is disposed adjacent to the first main surface no of the semiconductor substrate. For example, the surface of the support element may be insulated, e.g. by an oxide layer and suitable dopants may be introduced into the support element. According to further embodiments, electrically active components may also be disposed in a support element arranged at the second main surface 120 of the semiconductor substrate. In case of very fine structured support elements, relatively thick metallization layers may be formed by laterally growth of the metallization layer.

According to an embodiment, the following relationship may hold for the thickness m of the metallization layer 300, 400: $0.05 \times d \leq m \leq 10 \times d$, more specifically $0.1 \times d \leq m \leq 5 \times d$, and still more specifically $0.3 \times d \leq m \leq 3 \times d$. For example, a thickness m of the metallization layer may be 1 to 50 µm, e.g. 2 to 30 µm. Moreover, according to further embodiments, before forming the metallization layer, a material having a high heat conductivity (such as e.g. CVD diamond) may be formed on the surface of the support element to improve the heat transfer from the chip.

According to further embodiments, materials different from silicon may be used for forming the support element. Examples comprise SiC or carbon. For example, carbon may be used which has similar thermal properties as silicon and a similar module of elasticity. According to further embodiments, the support element may comprise material stacks comprising a first material adjacent to the semiconductor substrate and a further material. For example, the first material may be different from the material of the semiconductor substrate. Further examples of layer stacks may comprise GaN on Si or GaN on SiC or SiC on carbon.

FIGS. 3A to 3D illustrate a method of manufacturing a semiconductor device according to an embodiment.

The method described herein after is performed on a wafer level. Accordingly, the components of the single semiconductor chips are processed in a first main surface 110 of the semiconductor substrate (semiconductor wafer) 100. According to this embodiment, the support element 352 is formed on the second main surface 120 of the semiconductor substrate. As is clearly to be understood, the method may be slightly modified to form the support element 352 on the first main surface 110 of the semiconductor substrate 100.

Components of power transistors 200 are formed in a first main surface of the semiconductor substrate 100. In more detail, the components of the power transistors 200 are formed in the central portion 135 of the later semiconductor chips 102.

Thereafter, isolation trenches 240 may be formed in the first main surface no. The isolation trenches 240 may be formed in the kerf 140 of the later semiconductor chips 102. The isolation trenches 240 may be formed so as to define the later semiconductor chips 102. For example, they may extend in the first direction (e.g. the X direction) and the second direction (e.g. the Y direction) to define a checkerboard pattern. According to further embodiments, they may be formed so as to define a hexagonal or honeycomb pattern. The isolation trenches 240 are formed to a depth which is larger than a thickness of the semiconductor chips to be formed. For example, the isolation trenches may have a depth of larger than 20 µm. Further, a metallization layer 400 may be formed over the first main surface no. FIG. 3A shows an example of a resulting structure.

The metallization layer 400 may be patterned so as to form the front side metallization pads 410 disposed over the first main surface no of the semiconductor substrate. FIG. 3B shows an example of a resulting structure.

Thereafter, the semiconductor substrate 100 may be mounted to a suitable carrier 250 for handling ultra-thin wafers. For example, the carrier 250 may be a glass carrier or any other suitable carrier. The semiconductor substrate 100 may be carried by the carrier 250 by means of a suitable contact material 260 such as glue or an epoxy resin. The semiconductor substrate 100 is mounted to the carrier 250 so that the front side metallization pads 410 are embedded in the contact material 260. The first main surface no is disposed on a side adjacent to the carrier 250. FIG. 3C shows an example of a resulting structure.

Thereafter, a thinning process is performed so as to thin substrate material from the back side 115 of the semiconductor substrate 100. Examples of the thinning process comprise grinding, chemical mechanically polishing (CMP) or a combination of these processes. For example, thinning may be performed so as to expose a bottom side of the isolation trenches 240. Due to the fact that the semiconductor substrate 100 is carried by the contact material 260, the semiconductor wafer may not be separated due to this thinning process. Thereafter, the support element 352 may be formed. According to the present embodiment, the support element 352 may be formed by a suitable etching process.

For example, etching the substrate material may be performed using plasma etching and/or wet etching. According to a further embodiment, the etching process may comprise a method in which an etching rate depends on a crystal orientation. As a result, a support element having a tapered structure may be formed, wherein a width t increases with decreasing distance from the substrate surface. According to a further embodiment, different etching methods may be combined so as to form a supporting element having a tapered structure in its upper portion whereas the lower portion has an approximately constant width t. The etching process is performed so as to obtain a target thickness d of the semiconductor substrate portion 102. The end point of the etching process may be defined by setting a corresponding etching time of by defining an etch stop such as an etch stop layer.

As has been mentioned above, for example, at the same time stabilizing elements 351 may be formed in the kerf 140.

Thereafter, a metallization layer 300 may be formed over the resulting surface. According to an embodiment, the metallization layer 300 may be formed so as to embed the support element 352. According to a further embodiment, the metallization layer 300 may be formed so as to be flush with the support element 352.

Figure 3D:
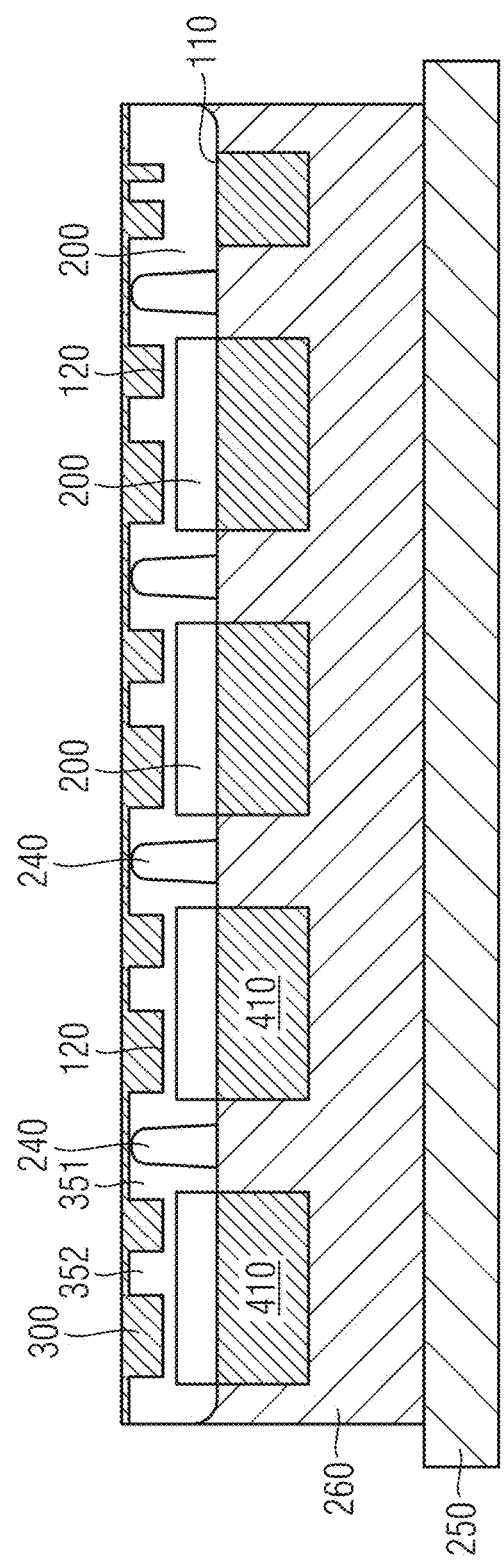

FIG. 3D shows an example of a resulting structure. After isolating the semiconductor wafer 100 into single chips 102, the structure as shown e.g. in FIGS. 1A to 1D may be obtained. For example, the single chips 102 may have a size larger than 5 mm$^2$. In a case of these comparably large chip sizes, the mechanical stability might become a problem. Due to the presence of the support element 352, the stability of the chip may be increased.

Figure 3E:
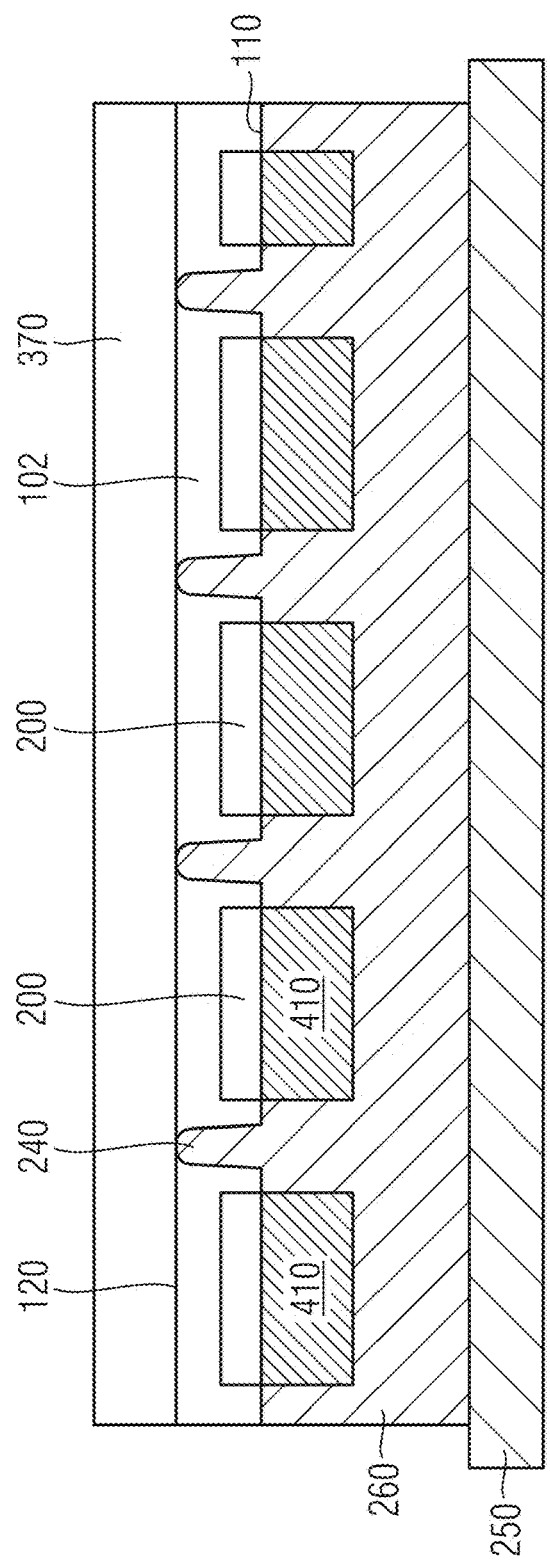
FIGS. 3E and 3F show modifications of the method of manufacturing a semiconductor device according to a further embodiment.

According to a further embodiment, the support element 352 may be formed in a support layer 370 which may be formed over the first or second main surface 110, 120. Starting from the structure shown in FIG. 3C, a thinning process is performed in the manner as has been explained above. For example, the thinning process may be performed to obtain a target thickness of the semiconductor substrate portions 102. Due to the thinning process, the bottom side of the isolation trenches 240 may be uncovered. Then, a support layer 370 is formed over the resulting surface. For example, the support layer 370 may comprise any of the materials described above for forming the support element 352. The support layer 370 may be formed to have a thickness h as described above and may be formed on the second main surface 120 of the semiconductor substrate 100. FIG. 3E shows an example of a resulting structure. As will be readily appreciated, the method may be modified so as to form the support layer 370 on the first main surface no of the semiconductor substrate 100.

Then, the support layer 370 is patterned using e.g. a photolithographical method. The support layer 370 may be patterned to form the support elements 352. At the same time, stabilizing elements 351 may be defined in the kerf of the semiconductor substrate portions 102. For example, etching may be performed in the manner as has been explained above. The end point of the etching process may be defined by setting a corresponding etching time of by defining an etch stop such as an etch stop layer.

Thereafter, a metallization layer 300 may be formed over the resulting surface. According to an embodiment, the metallization layer 300 may be formed so as to embed the support element 352. According to a further embodiment, the metallization layer 300 may be formed so as to be flush with the support element 352.

Figure 3F:
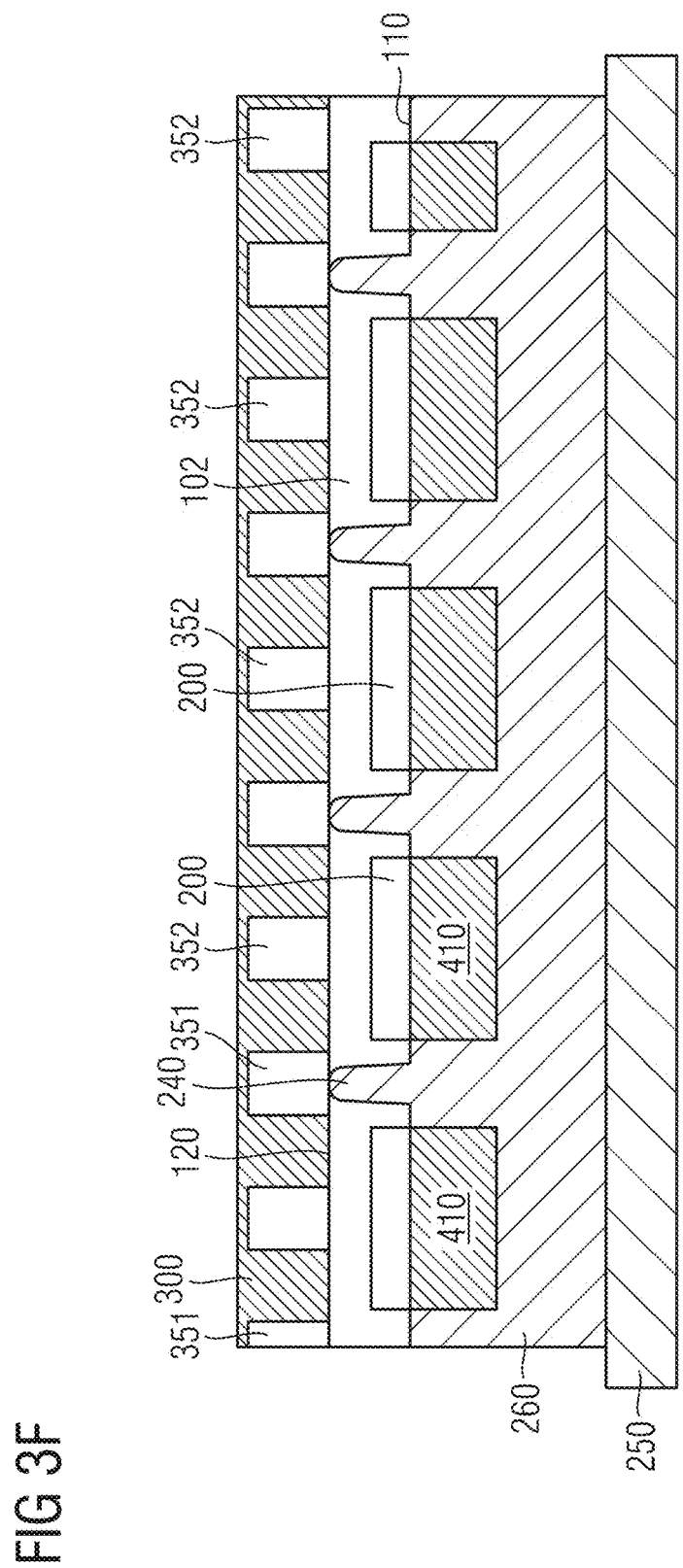

FIG. 3F shows an example of a resulting structure. After isolating the semiconductor wafer 100 into single chips 102, the structure as shown e.g. in FIGS. 1A to 1D may be obtained. For example, the single chips 102 may have a size larger than 5 mm². In a case of these comparably large chip sizes, the mechanical stability might become a problem. Due to the presence of the support element 352, the stability of the chip may be increased.

Figure 4A:
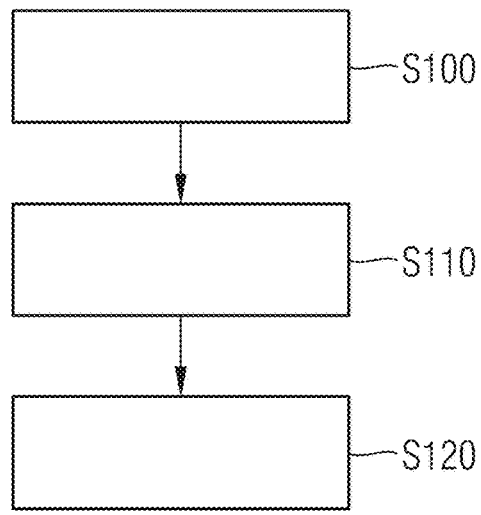
FIG. 4A summarizes a method according to an embodiment.

FIG. 4A summarizes a method of manufacturing a semiconductor device comprising a power transistor in a semiconductor substrate portion according to an embodiment. As is shown, the method comprises forming components of the power transistor in a first main surface of a semiconductor substrate in a central portion of the semiconductor substrate portion (S100), thinning the semiconductor substrate to a thickness less than 100 μm (S110), and patterning a second main surface of the semiconductor substrate to form a support element extending in a horizontal direction over the second main surface in the central portion of the semiconductor portion (S120).

Figure 4B:
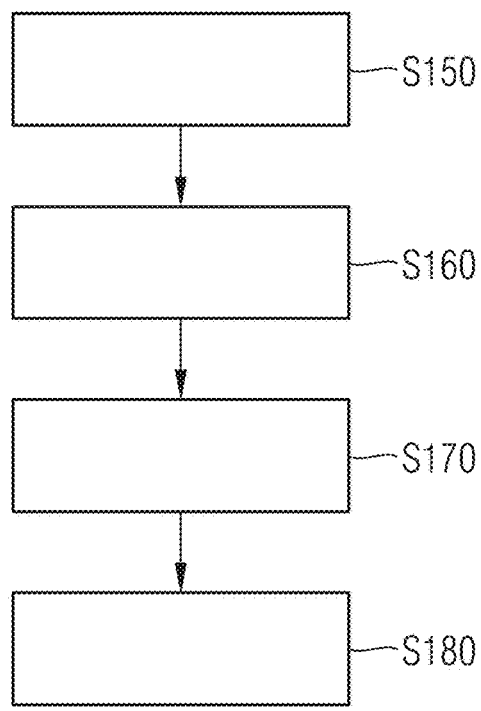
FIG. 4B summarizes a method according to a further embodiment.

FIG. 4B shows a method according to a further embodiment. As is illustrated, the method comprises forming components of the power transistor in a first main surface of a semiconductor substrate in a central portion of the semiconductor substrate portion (S150), thinning the semiconductor substrate to a thickness less than 100 μm (S160), forming a support layer over a surface of the semiconductor substrate (S170), and patterning the support layer to form a support element extending in a horizontal direction over the surface of the semiconductor substrate in the central portion of the semiconductor portion (S180).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising:
   a power transistor in a semiconductor substrate portion, the semiconductor substrate portion comprising a central portion and a kerf, components of the power transistor being arranged in the central portion, the central portion having a thickness d; and
   a support element in direct physical contact with a main surface of the central portion, the support element having a smallest lateral extension t at a side adjacent to the main surface of the semiconductor substrate portion and a height h, wherein $0.1 \times h \leq d \leq 4 \times h$ and $0.1 \times h \leq t \leq 1.5 \times h$.

2. The semiconductor device according to claim 1, wherein a distance s between the support element and an adjacent further support element fulfills the following relationship: $t \leq s \leq 100 \times t$.

3. The semiconductor device according to claim 1, further comprising a stabilizing element arranged in the kerf and disposed over the main surface.

4. The semiconductor device according to claim 3, wherein a distance k between the support element and the stabilizing element fulfills the following relationship: $t \leq k \leq 100 \times t$.

5. The semiconductor device according to claim 1, further comprising a metallization layer, the support element being embedded in the metallization layer.

6. The semiconductor device according to claim 5, wherein a part of the metallization layer is disposed over the support element.

7. The semiconductor device according to claim 5, wherein a thickness m of the metallization layer fulfills the following relationship: $0.05 \times d \leq m \leq 10 \times d$.

8. The semiconductor device according to claim 1, wherein a source region of the power transistor is arranged at a first main surface of the semiconductor substrate portion, the support element being disposed at a second main surface of the semiconductor substrate portion.

9. The semiconductor device according to claim 1, wherein the support element comprises a semiconductor substrate material.

10. The semiconductor device according to claim 1, wherein the support element comprises carbon.

11. The semiconductor device according to claim 1, wherein the support element has a tapered shape, wherein a width of the support element at a side adjacent to the main surface is larger than a width of the of the support element at a side remote from the main surface.

12. The semiconductor device according to claim 1, wherein the thickness d of the semiconductor substrate portion is less than 20 μm.

13. A method of forming a semiconductor device, the method comprising:
   forming a power transistor in a semiconductor substrate portion, the semiconductor substrate portion comprising a central portion and a kerf, components of the power transistor being arranged in the central portion, the central portion having a thickness d; and forming a support element in direct physical contact with a main surface of the central portion, the support element having a smallest lateral extension t at a side adjacent to the main surface of the semiconductor substrate portion and a height h, wherein $0.1 \times h \leq 4 \times h$ and $0.1 \times h \leq t \leq 1.5 \times h$.

14. The method of claim 13, wherein a distance s between the support element and an adjacent further support element fulfills the following relationship: $t \leq s \leq 100 \times t$.

15. The method of claim 13, further comprising arranging a stabilizing element in the kerf and disposed over the main surface.

16. The method of claim 15, wherein a distance k between the support element and the stabilizing element fulfills the following relationship: $t \leq k \leq 100 \times t$.

17. The method of claim 13, further comprising forming a metallization layer, the support element being embedded in the metallization layer.

18. The method of claim 17, wherein a part of the metallization layer is disposed over the support element.

19. The method of claim 17, wherein a thickness m of the metallization layer fulfills the following relationship: $0.05 \times d \leq m \leq 10 \times d$.

20. The method of claim 13, wherein a source region of the power transistor is arranged at a first main surface of the semiconductor substrate portion, the support element being disposed at a second main surface of the semiconductor substrate portion.

21. The method of claim 13, wherein the support element comprises a semiconductor substrate material.

22. The method of claim 13, wherein the support element comprises carbon.

23. The method of claim 13, wherein the support element has a tapered shape, wherein a width of the support element at a side adjacent to the main surface is larger than a width of the of the support element at a side remote from the main surface.

24. The method of claim 13, wherein the thickness d of the semiconductor substrate portion is less than 20 µm.

* * * * *